United States Patent
Yuda

(10) Patent No.: US 9,124,063 B2
(45) Date of Patent: Sep. 1, 2015

(54) DRIVE CIRCUIT AND OPTICAL NETWORK UNIT

(75) Inventor: Shuitsu Yuda, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/110,247

(22) PCT Filed: Apr. 2, 2012

(86) PCT No.: PCT/JP2012/058949
§ 371 (c)(1),
(2), (4) Date: Oct. 7, 2013

(87) PCT Pub. No.: WO2013/031275
PCT Pub. Date: Mar. 7, 2013

(65) Prior Publication Data
US 2014/0023374 A1  Jan. 23, 2014

(30) Foreign Application Priority Data
Aug. 31, 2011  (JP) .................. 2011-188484

(51) Int. Cl.
| | | |
|---|---|---|
| H01S 3/00 | (2006.01) | |
| H01S 5/06 | (2006.01) | |
| H01S 5/042 | (2006.01) | |
| H04J 14/08 | (2006.01) | |

(52) U.S. Cl.
CPC ............... *H01S 5/06* (2013.01); *H01S 5/0427* (2013.01); *H04J 14/08* (2013.01)

(58) Field of Classification Search
CPC .... H04B 10/50; H04B 10/501; H04B 10/502; H04B 10/503; H04J 14/08; H01S 5/06; H01S 5/0427
USPC ............ 398/182, 192, 98; 372/38.02
See application file for complete search history.

(56) References Cited

U.S. PATENT DOCUMENTS 7,054,344 B1 * 5/2006 Nguyen ............... 372/38.02
2010/0183318 A1 * 7/2010 Tanaka ................. 398/201

FOREIGN PATENT DOCUMENTS

| JP | H09-46295 A | 2/1997 |
| JP | 2008-041907 A | 2/2008 |
| JP | 2010-267924 A | 11/2010 |
| JP | 2010267924 A * | 11/2010 |

OTHER PUBLICATIONS

IEEE Standards, "802.3ah™, IEEE Standard for Information technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment: Media Access Control Parameters, Physical Layers, and Management Parameters for Subscriber Access Netowrks", IEEE Std 802.3ah™-2004 (Amendment to IEEE Std 802.3™-2002 as amended by IEEE Stds 802.3ae™-2002, 802.3af™-2002, 802.3aj™-2003 and 802.3ak™-2004), IEEE Computer Society, Sep. 7, 2004, pp. 1-623.

* cited by examiner

*Primary Examiner* — Dalzid Singh
(74) *Attorney, Agent, or Firm* — Drinker Biddle & Reath LLP

(57) ABSTRACT

A drive circuit includes a bias current supply circuit for supplying a bias current to a light-emitting device for transmitting an optical signal, the light-emitting device included in a light-emitting circuit; and a modulation current supply circuit for supplying a modulation current of a magnitude according to a logical value of data to be transmitted, to the light-emitting device. The modulation current supply circuit includes a differential drive circuit for switching whether to supply a current to the light-emitting device, according to the logical value of the data; and a termination resistor connected between differential outputs of the differential drive circuit. The differential drive circuit and the light-emitting circuit are DC-coupled to each other, and power supply of the current supplied to the light-emitting device by the differential drive circuit is supplied from the light-emitting circuit.

4 Claims, 14 Drawing Sheets

DRIVE CIRCUIT AND OPTICAL NETWORK UNIT

TECHNICAL FIELD

The present invention relates to a drive circuit and an optical network unit, and more particularly to a drive circuit that drives a light-emitting device for transmitting an optical signal, and an optical network unit including the drive circuit.

BACKGROUND ART

In recent years, the Internet has proliferated widely. Thus, users can access various information on sites run around the world and obtain the information. Accordingly, apparatuses capable of performing broadband access such as ADSL (Asymmetric Digital Subscriber Line) and FTTH (Fiber To The Home) have also been widely used at a rapid pace.

IEEE Std 802.3ah (registered trademark)—2004 (Non-Patent Literature 1) discloses one system of a passive optical network (PON) which is medium-sharing communication where a plurality of optical network units (ONUs) perform data transmission with an optical line terminal (OLT) by sharing an optical communication line. Specifically, there are defined EPON (Ethernet (registered trademark) PON) where all pieces of information including user information passing through the PON and control information for managing and operating the PON are communicated in Ethernet (registered trademark) frame format; and an access control protocol (MPCP (Multi-Point Control Protocol)) and an OAM (Operations Administration and Maintenance) protocol for EPON. By exchanging MPCP frames between the optical line terminal and the optical network units, joining, leaving, and upstream access multiple control of the optical network units, etc., are performed. In addition, Non-Patent Literature 1 describes a new-optical network unit registration method, a report indicating a bandwidth allocation request, and a gate indicating a transmission instruction, by MPCP messages.

Note that even in 10G-EPON which is standardized as IEEE 802.3av (registered trademark)—2009 as the next-generation technology of GE-PON (Giga Bit Ethernet (registered trademark) Passive Optical Network) which is EPON achieving a communication speed of 1 gigabit per second, i.e., EPON whose communication speed is equivalent to 10 gigabits per second, an access control protocol is premised on MPCP.

A laser drive circuit used in a transmitter for optical communication is disclosed in Japanese Unexamined Patent Publication No. 2010-267924 (Patent Literature 1). Specifically, the laser drive circuit includes a modulation circuit that supplies a modulation current to a laser diode according to burst data to be inputted; and a bias circuit that provides a bias current to the laser diode. The modulation circuit includes a differential drive circuit. The differential drive circuit and the laser diode are AC-coupled to each other by a capacitive element. In addition, in the differential drive circuit, a termination resistor for impedance matching is connected between a pair of transistors and a power supply line.

CITATION LIST

Non-Patent Literature

Non-Patent Literature 1: IEEE Std 802.3ah (registered trademark)—2004

Patent Literature

Patent Literature 1: Japanese Unexamined Patent Publication No. 2010-267924

SUMMARY OF INVENTION

Technical Problem

A PON system adopts a time-division multiplexing scheme as a communication scheme for the upstream direction from an optical network unit to an optical line terminal. In the time-division multiplexing scheme, the optical network unit transmits a burst optical signal to the optical line terminal. Hence, the optical network unit needs to supply a current to a light-emitting device such as a laser diode during a period during which the burst optical signal is to be transmitted, and stop the supply of the current during other periods.

Hence, burst response characteristics, i.e., the on/off speed characteristics of a current supplied to the light-emitting device, are important for the optical network unit.

In particular, in 10G-EPON, compared to GE-PON, the transmission time of a burst optical signal from each optical network unit is reduced due to an increase in line speed, increasing the number of optical network units that can be connected to the optical line terminal. Therefore, there is a need to improve the throughput of the PON system by improving burst response characteristics to reduce time intervals between burst optical signals from the respective optical network units.

However, when it is assumed that the laser drive circuit described in Patent Literature 1 is used in an optical network unit of the PON system, since the differential drive circuit and a light-emitting device such as a laser diode are AC-coupled to each other by the capacitive element, burst response characteristics deteriorate by the time constants of the termination resistor and the capacitive element.

To prevent such a deterioration of burst response characteristics, a configuration is considered in which, for example, DC coupling by a resistor is performed instead of AC coupling. However, in such a configuration, a reactive current which does not contribute to the drive of the light-emitting device may flow from the differential drive circuit to the bias circuit through the DC coupling.

The present invention is made to solve the above-described problem. An object of the present invention is therefore to provide a drive circuit and an optical network unit that are capable of reducing a reactive current which does not contribute to the drive of a light-emitting device for transmitting an optical signal.

Solution to Problem

To solve the above-described problem, the drive circuit according to one aspect of the present invention comprises: a bias current supply circuit for supplying a bias current to a light-emitting device for transmitting an optical signal, the light-emitting device being included in a light-emitting circuit; and a modulation current supply circuit for supplying the light-emitting device with a modulation current of a magnitude according to a logical value of data to be transmitted, wherein the modulation current supply circuit includes: a differential drive circuit for switching whether to supply a current to the light-emitting device according to the logical value of the data; and a termination resistor connected between differential outputs of the differential drive circuit, and, the differential drive circuit and the light-emitting circuit are DC-coupled to each other, and power supply of the current supplied to the light-emitting device by the differential drive circuit is supplied from the light-emitting circuit.

By such a configuration, the impedance of a path for a reactive current increases. Thus, a reactive current which does not contribute to the drive of the light-emitting device is reduced, enabling to reduce power consumption.

Preferably, the termination resistor is AC-coupled to a node without interposing the light-emitting circuit, the node being supplied with a fixed voltage.

By such a configuration, a reactive current which does not contribute to the drive of the light-emitting device is reduced and ringing of a burst optical signal is prevented, enabling to stabilize burst response.

Preferably, the differential drive circuit includes: a first transistor having a first conduction electrode and a second conduction electrode, the first conduction electrode being DC-coupled to a first end of the light-emitting device; a second transistor having a first conduction electrode and a second conduction electrode, the first conduction electrode being DC-coupled to a second end of the light-emitting device, and the second conduction electrode being electrically connected to the second conduction electrode of the first transistor; and a first termination resistor and a second termination resistor that are connected in series between the first conduction electrode of the first transistor and the first conduction electrode of the second transistor, wherein a connection node between the first conduction electrode of the first transistor and the first termination resistor is DC-coupled to a connection node between the first end of the light-emitting device and a node to which a direct-current power supply voltage is supplied, and a connection node between the first conduction electrode of the second transistor and the second termination resistor is DC-coupled to a connection node between the second end of the light-emitting device and the bias current supply circuit.

By such a configuration, an appropriate circuit that DC-couples the differential drive circuit and the termination resistors to the light-emitting device can be provided.

More preferably, the modulation current supply circuit further includes: a capacitor connected between a node to which a fixed voltage is supplied and a connection node between the first termination resistor and the second termination resistor.

By such a configuration, an appropriate circuit that stabilizes the potential of the connection node between the termination resistors can be provided.

To solve the above-described problem, the optical network unit according to one aspect of the present invention is an optical network unit in a communication system where optical signals from a plurality of optical network units to an optical line terminal are time-division multiplexed, the optical network unit comprising: a light-emitting circuit including a light-emitting device for transmitting the optical signal; and a drive circuit for driving the light-emitting device, wherein the drive circuit includes: a bias current supply circuit for supplying a bias current to the light-emitting device; and a modulation current supply circuit for supplying the light-emitting device with a modulation current of a magnitude according to a logical value of data to be transmitted, and, the modulation current supply circuit includes: a differential drive circuit for switching whether to supply a current to the light-emitting device according to the logical value of the data; and a termination resistor connected between differential outputs of the differential drive circuit, and, the differential drive circuit and the light-emitting circuit are DC-coupled to each other, and power supply of the current supplied to the light-emitting device by the differential drive circuit is supplied from the light-emitting circuit.

By such a configuration, the impedance of a path for a reactive current increases. Thus, a reactive current which does not contribute to the drive of the light-emitting device is reduced, enabling to reduce power consumption.

Advantageous Effects of Invention

According to the present invention, a reactive current which does not contribute to the drive of the light-emitting device for transmitting an optical signal can be reduced.

DESCRIPTION OF EMBODIMENTS

Figure 1:
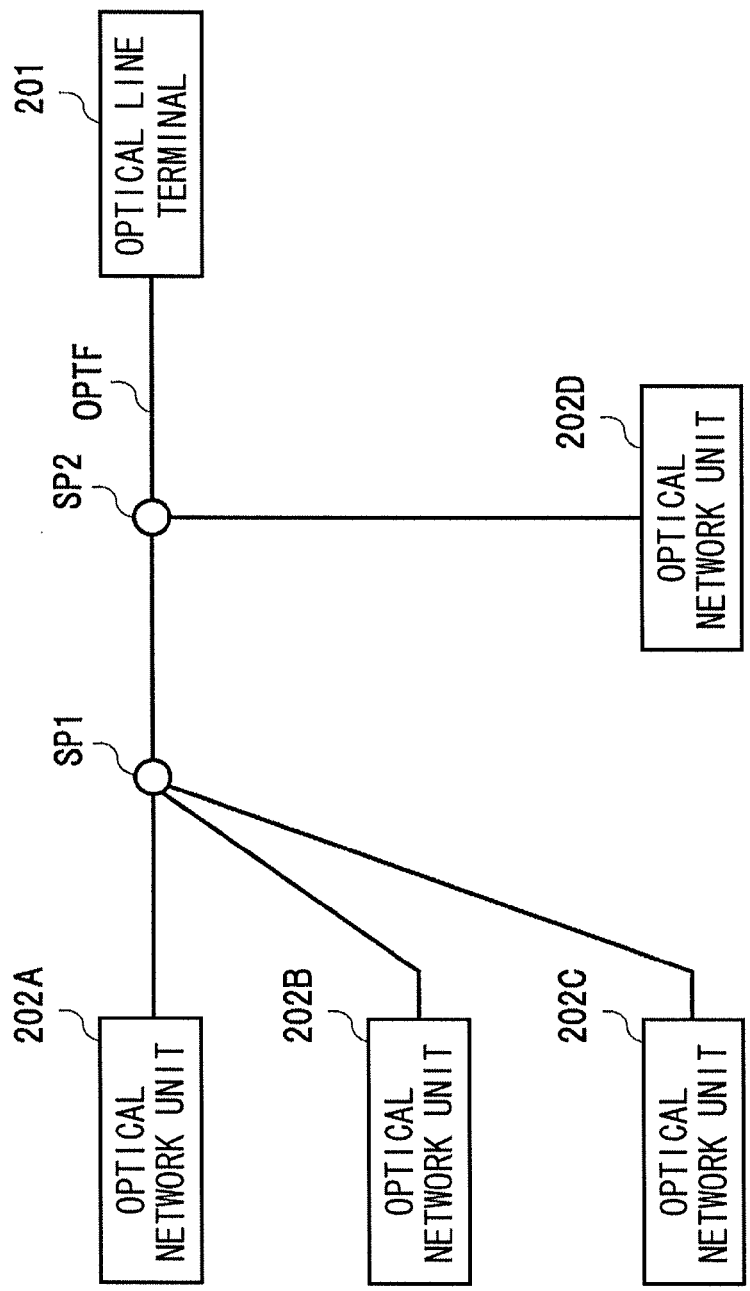
FIG. 1 is a diagram showing a configuration of a PON system according to an embodiment of the present invention.

An embodiment of the present invention will be described below using the drawings. Note that the same or corresponding portions in the drawings are denoted by the same reference signs and description thereof is not repeated.

FIG. 1 is a diagram showing a configuration of a PON system according to an embodiment of the present invention.

Referring to FIG. 1, a PON system 301 is, for example, 10G-EPON and includes optical network units 202A, 202B, 202C, and 202D, an optical line terminal 201, and splitters SP1 and SP2. The optical network units 202A, 202B, and 202C and the optical line terminal 201 are connected to each other through the splitters SP1 and SP2 and an optical fiber OPTF, and transmit and receive optical signals to/from each other. The optical network unit 202D and the optical line terminal 201 are connected to each other through the splitter SP2 and the optical fiber OPTF, and transmit and receive optical signals to/from each other. In the PON system 301, optical signals from the optical network units 202A, 202B, 202C, and 202D to the optical line terminal 201 are time-division multiplexed.

Figure 2:
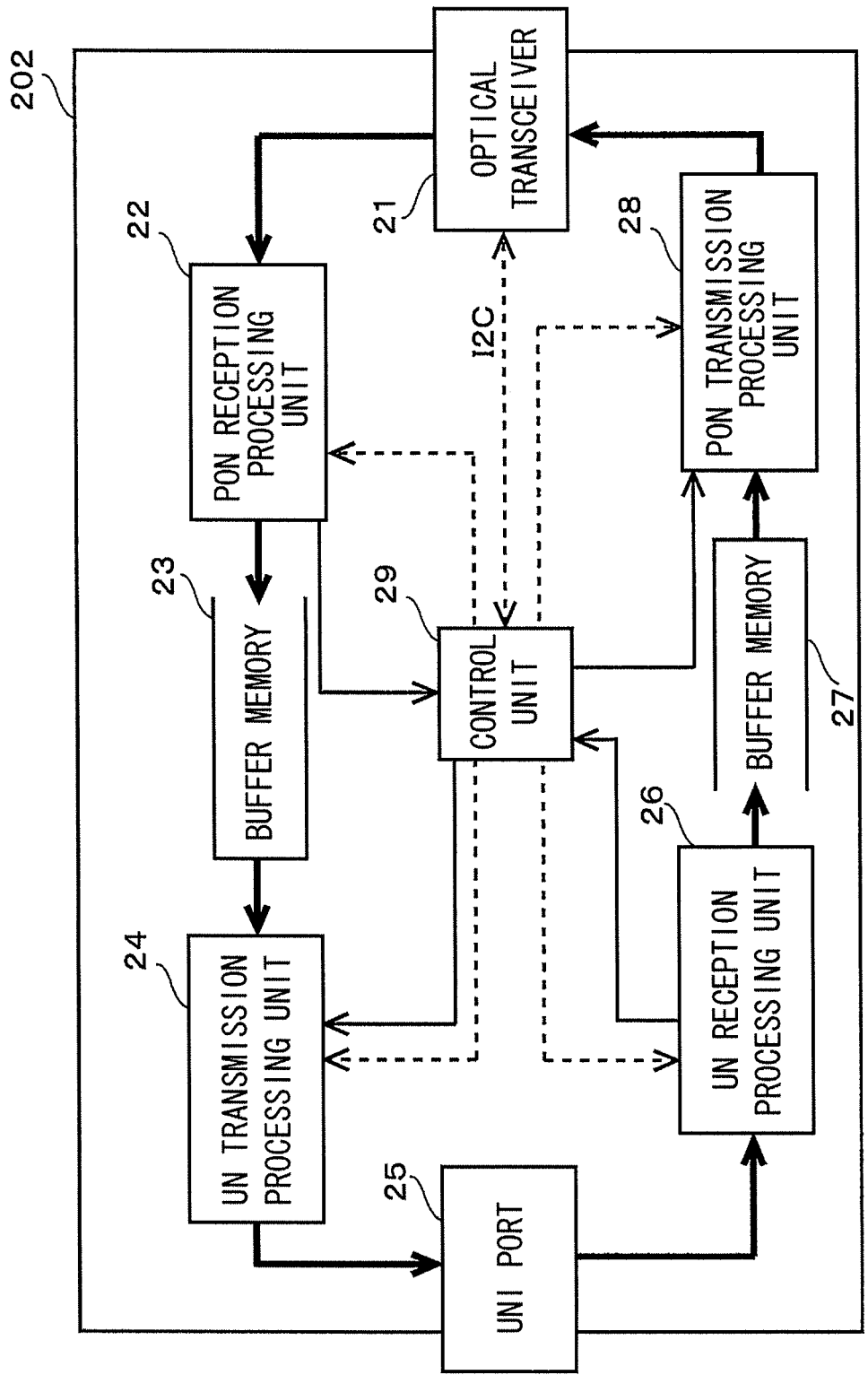
FIG. 2 is a diagram showing a configuration of an optical network unit in the PON system according to the embodiment of the present invention.

FIG. 2 is a diagram showing a configuration of an optical network unit in the PON system according to the embodiment of the present invention.

Referring to FIG. 2, an optical network unit 202 includes an optical transceiver 21, a PON reception processing unit 22, a buffer memory 23, a UN transmission processing unit 24, a UNI (User Network Interface) port 25, a UN reception processing unit 26, a buffer memory 27, a PON transmission processing unit 28, and a control unit 29.

The optical transceiver 21 is removable from the optical network unit 202. The optical transceiver 21 receives a downstream optical signal transmitted from the optical line terminal 201 and converts the downstream optical signal into an electrical signal and then outputs the electrical signal.

The PON reception processing unit 22 reconstructs a frame from the electrical signal received from the optical transceiver 21, and sorts the frame into the control unit 29 or the UN transmission processing unit 24, according to the type of the frame. Specifically, the PON reception processing unit 22 outputs a data frame to the UN transmission processing unit 24 via the buffer memory 23, and outputs a control frame to the control unit 29.

The control unit 29 generates a control frame including various types of control information and outputs the control frame to the UN transmission processing unit 24.

The UN transmission processing unit 24 transmits, via the UNI port 25, the data frame received from the PON reception processing unit 22 and the control frame received from the control unit 29, to a user terminal such as a personal computer which is not shown.

The UN reception processing unit 26 outputs a data frame received from the user terminal via the UNI port 25, to the PON transmission processing unit 28 via the buffer memory 27, and outputs a control frame received from the user terminal via the UNI port 25, to the control unit 29.

The control unit 29 performs a home-side process pertaining to the control and management of a PON line between the optical line terminal 201 and the optical network unit 202, such as MPCP and OAM. Specifically, by exchanging MPCP messages and OAM messages with the optical line terminal 201 connected to the PON line, various types of control such as access control are performed. The control unit 29 generates a control frame including various types of control information and outputs the control frame to the PON transmission processing unit 28. In addition, the control unit 29 performs various types of setting processes for the respective units in the optical network unit 202.

The PON transmission processing unit 28 outputs the data frame received from the UN reception processing unit 26 and the control frame received from the control unit 29, to the optical transceiver 21.

The optical transceiver 21 converts the data frame and control frame received from the PON transmission processing unit 28, into an optical signal and transmits the optical signal to the optical line terminal 201.

Figure 3:
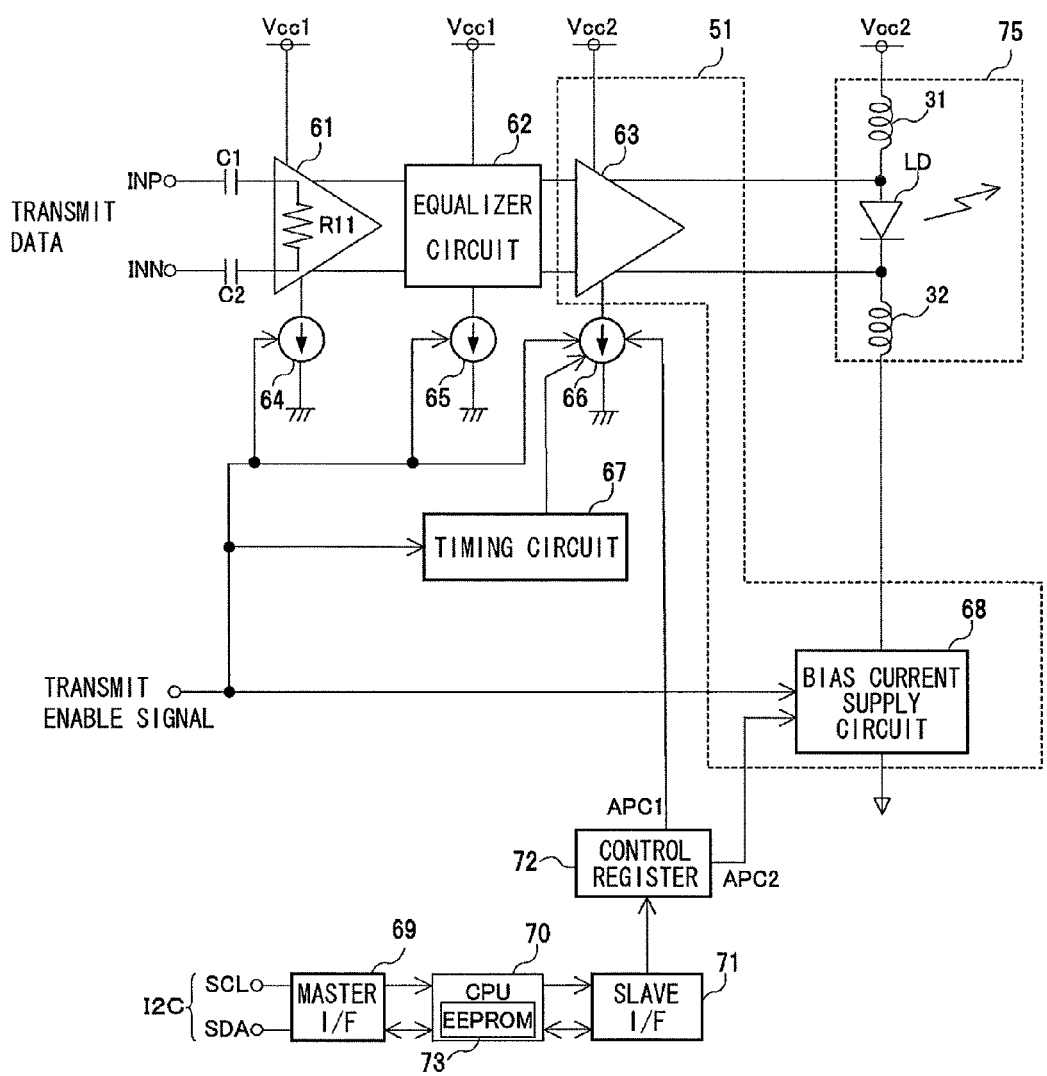
FIG. 3 is a diagram showing a detailed configuration of the transmitter side of an optical transceiver in the optical network unit according to the embodiment of the present invention.

FIG. 3 is a diagram showing a detailed configuration of the transmitter side of the optical transceiver in the optical network unit according to the embodiment of the present invention.

Referring to FIG. 3, the optical transceiver 21 includes a prebuffer circuit 61, an equalizer circuit 62, a drive circuit 51, current sources 64 to 66, a timing circuit 67, a light-emitting circuit 75, a master I/F (interface) 69, a CPU (Central Processing Unit) 70, a slave I/F 71, a control register 72, and capacitors C1 and C2. The drive circuit 51 includes an output buffer circuit (modulation current supply circuit) 63 and a bias current supply circuit 68. The prebuffer circuit 61 includes a termination resistor R11. The light-emitting circuit 75 includes a light-emitting device LD and inductors 31 and 32. The CPU 70 includes a memory unit 73 which is, for example, an EEPROM (Electrically Erasable Programmable Read Only Memory).

The prebuffer circuit 61 receives transmit data which is a data frame from the UN reception processing unit 26 and a control frame from the control unit 29, at the termination resistor R11 through the capacitors C1 and C2, and amplifies the transmit data and then outputs the amplified transmit data. For example, the prebuffer circuit 61 receives the transmit data through signal lines INP and INN, as balanced signals.

The equalizer circuit 62 performs waveform shaping, e.g., phase distortion correction, on the transmit data received from the prebuffer circuit 61, and outputs the transmit data.

The drive circuit 51 drives the light-emitting device LD in the light-emitting circuit 75. More specifically, the output buffer circuit 63 includes, for example, a differential drive circuit having two transistors, and supplies a differential modulation current to the light-emitting circuit 75, based on the transmit data received from the equalizer circuit 62. The modulation current is a current of a magnitude according to the logical value of data to be transmitted to the optical line terminal 201. By the configuration using a differential drive circuit, the response speed of a modulation current with respect to a change in the logical value of transmit data can be improved.

The light-emitting circuit 75 transmits an upstream optical signal to the optical line terminal 201. In the light-emitting circuit 75, the light-emitting device LD is connected through the inductor 31 to a power supply node to which a power supply voltage Vcc2 is supplied, and is connected through the inductor 32 to the bias current supply circuit 68. The light-emitting device LD emits light based on a bias current supplied from the bias current supply circuit 68 and the modulation current supplied from the output buffer circuit 63, and changes light emission intensity.

The current sources 64 to 66 supply, as power, for example, currents to the prebuffer circuit 61, the equalizer circuit 62, and the output buffer circuit 63, respectively, and can control the start and stop of power supply. More specifically, the current sources 64 to 66 switch whether to supply power to the prebuffer circuit 61, the equalizer circuit 62, and the output buffer circuit 63, respectively, based on a transmit enable signal received from the control unit 29.

Specifically, the current sources 64 to 66 perform power supply to the prebuffer circuit 61, the equalizer circuit 62, and the output buffer circuit 63, respectively, when the transmit enable signal is activated, and stops the power supply when the transmit enable signal is deactivated.

In addition, the timing circuit 67 performs control to forcibly stop supply of a modulation current from the output buffer circuit 63 to the light-emitting device LD.

The bias current supply circuit 68 supplies, as power, a bias current to the light-emitting circuit 75. In addition, the bias current supply circuit 68 switches whether to supply a bias current to the light-emitting circuit 75, based on a transmit enable signal received from the control unit 29. Here, in the optical transceiver 21, the value of a bias current is set such that the light-emitting device LD emits light when a bias current is supplied to the light-emitting device LD in a state in which the magnitude of a modulation current to the light-emitting device LD is zero.

In the light-emitting circuit 75, the inductor 31 has a first end connected to the power supply node to which a power supply voltage Vcc2 is supplied, and a second end. The light-emitting device LD is, for example, a laser diode and has an anode connected to the second end of the inductor 31 and a cathode connected to a first end of the inductor 32. A modulation current outputted from the output buffer circuit 63 flows from the anode to the cathode of the light-emitting device LD.

The power supply voltage Vcc2 is higher in level than a power supply voltage Vcc1. The power supply voltage Vcc1 is supplied to, for example, the prebuffer circuit 61 and the equalizer circuit 62. In addition, the power supply voltage Vcc2 is supplied to, for example, the output buffer circuit 63. The power supply voltage Vcc1 and the power supply voltage Vcc2 are direct-current voltages.

The CPU 70 exchanges various types of data with the control unit 29 via, for example, an I2C bus including a signal line SCL and a signal line SDA.

The master I/F 69 provides an interface function between the CPU 70 and the I2C bus.

The slave I/F 71 provides an interface function between the CPU 70 and the control register 72.

The CPU 70 writes various control data to the control register 72 through the slave I/F 71.

The current source 66 changes the amount of current supplied to the output buffer circuit 63, based on control data APC1 written to the control register 72.

The bias current supply circuit 68 changes the amount of current supplied to the light-emitting circuit 75, based on control data APC2 written to the control register 72.

Figure 4:
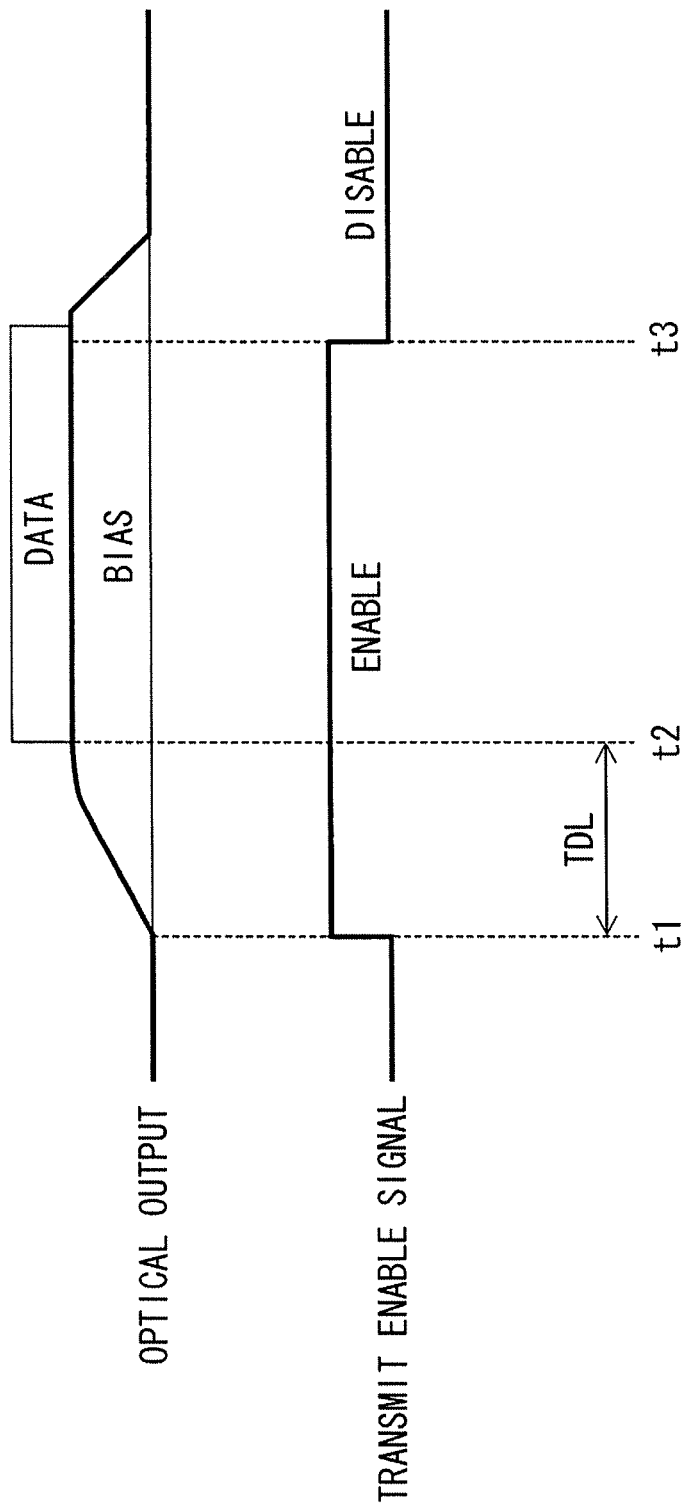
FIG. 4 is a diagram showing an optical output and a transmit enable signal in the optical transceiver of the optical network unit according to the embodiment of the present invention.

FIG. 4 is a diagram showing an optical output and a transmit enable signal in the optical transceiver of the optical network unit according to the embodiment of the present invention. Note that the portion of the waveform of the optical output indicated as "data" actually has a waveform that changes between the level of only the "bias" portion and the level of a combination of the "bias" portion and the "data" portion, according to the logical value of transmit data.

Referring to FIG. 4, first, the transmit enable signal is deactivated during a period during which transmission of an upstream optical signal is not allowed by the optical line terminal 201. In this case, the bias current supply circuit 68 does not operate and thus a bias current is not generated.

Then, when transmission of an upstream optical signal is allowed by the optical line terminal 201, in order to transmit an upstream optical signal from the optical network unit 202, the transmit enable signal is activated. By this, the bias current supply circuit 68 starts its operation and generates a bias current and supplies the bias current to the light-emitting device LD.

In addition, when the transmit enable signal is activated, the current sources 64 to 66 start their operation and supply currents to the prebuffer circuit 61, the equalizer circuit 62, and the output buffer circuit 63, respectively. Note, however, that a modulation current from the output buffer circuit 63 is not supplied to the light-emitting device LD by control of the timing circuit 67 (timing t1).

Namely, the timing circuit 67 forcibly stops supply of a modulation current from the output buffer circuit 63 to the light-emitting device LD during a period from timing t1 to timing t2 after a lapse of time TDL. By this, the occurrence of an overshoot caused by a modulation current flowing in a state in which the level of the bias current is unstable, etc., can be prevented, enabling to stabilize the circuit operation.

Then, when time TDL has elapsed and supply of a modulation current to the light-emitting device LD starts (timing t2), a preamble which is invalid data starts to be transmitted. Thereafter, transmission of valid data starts.

Then, when the transmit enable signal is deactivated to stop the transmission of the upstream optical signal from the optical network unit 202 (timing t3), the output buffer circuit 63 and the bias current supply circuit 68 stop their operation and thus the generation of a bias current and a modulation current stops.

Figure 5:
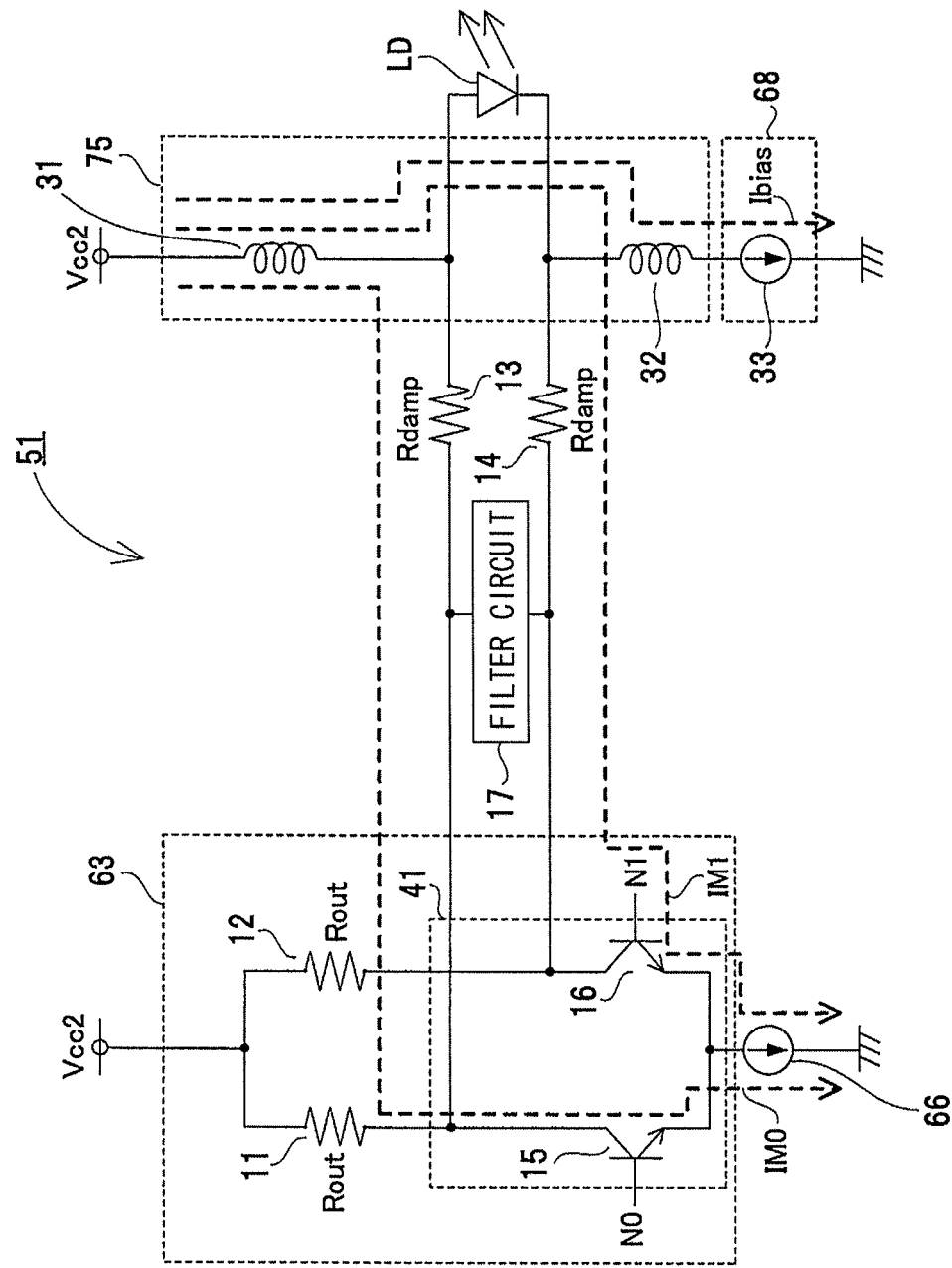
FIG. 5 is a diagram showing a configuration for the case in which it is assumed that measures are not taken against a reactive current in a drive circuit of the optical transceiver according to the embodiment of the present invention.

FIG. 5 is a diagram showing a configuration for the case in which it is assumed that measures are not taken against a reactive current in the drive circuit of the optical transceiver according to the embodiment of the present invention.

Referring to FIG. 5, the drive circuit 51 further includes resistors 13 and 14 and a filter circuit 17. The output buffer circuit 63 includes resistors 11 and 12 and a differential drive circuit 41. The differential drive circuit 41 includes N-channel MOS transistors 15 and 16. The bias current supply circuit 68 includes a current source 33.

The differential drive circuit 41 switches whether to supply a current to the light-emitting device LD, according to the logical value of transmit data.

The resistors 11 and 12 are connected between differential outputs of the differential drive circuit 41. The resistor 11 and the resistor 12 are connected in series between a drain of the N-channel MOS transistor 15 and a drain of the N-channel MOS transistor 16.

More specifically, the resistor 11 has a first end connected to a power supply node to which a power supply voltage Vcc2 is supplied, and a second end. The resistor 12 has a first end connected to the power supply node to which a power supply voltage Vcc2 is supplied, and a second end. The N-channel MOS transistor 15 has the drain connected to the second end of the resistor 11, a source connected to a first end of the current source 66, and a gate connected to a data node N0. The N-channel MOS transistor 16 has the drain connected to the second end of the resistor 12, a source connected to the first end of the current source 66, and a gate connected to a data node N1. A second end of the current source 66 is connected to a ground node to which a ground voltage is supplied. In addition, the current source 33 in the bias current supply circuit 68 is connected between a second end of the inductor 32 and a ground node.

The data node N0 is activated when the transmit data has the logical value "0". The data node N1 is activated when the transmit data has the logical value "1".

The differential drive circuit 41 and the light-emitting circuit 75 are DC-coupled (direct-current coupled) to each other. Namely, a connection node between the N-channel MOS transistor 15 and the resistor 11 is direct-current coupled to a connection node between the anode of the light-emitting device LD and a node to which a power supply voltage Vcc2 which is a direct-current power supply voltage is supplied. A connection node between the N-channel MOS transistor 16 and the resistor 12 is direct-current coupled to a connection node between the cathode of the light-emitting device LD and the bias current supply circuit 68.

More specifically, the connection node between the second end of the resistor 11 and the drain of the N-channel MOS transistor 15 and the connection node between the second end of the inductor 31 and the anode of the light-emitting device LD are connected to each other through the resistor 13. The connection node between the second end of the resistor 12 and the drain of the N-channel MOS transistor 16 and the connection node between the first end of the inductor 32 and the cathode of the light-emitting device LD are connected to each other through the resistor 14.

In the output buffer circuit 63, the resistors 11 and 12 are termination resistors for impedance matching. In particular, in 10G-EPON, the resistors 11 and 12 are useful for preventing ringing of a burst optical signal.

The light-emitting device LD is included in, for example, an assembly light-emitting module. The output buffer circuit 63, the filter circuit 17, the resistors 13 and 14, the light-emitting circuit 75, and the bias current supply circuit 68 are mounted on a printed circuit board (PCB). The light-emitting circuit 75 and the light-emitting module are connected to each other with a flexible printed circuit board (FPC) therebetween.

Connections between the differential outputs of the differential drive circuit 41 in the output buffer circuit 63 and the light-emitting device LD are established by transmission lines. More specifically, a connection between the connection node between the drain of the N-channel MOS transistor 15 and the resistor 11 and the anode of the light-emitting device LD is established by a transmission line such as a microstrip line. In addition, a connection between the connection node between the drain of the N-channel MOS transistor 16 and the resistor 12 and the cathode of the light-emitting device LD is established by a transmission line such as a microstrip line. The transmission lines have a length of, for example, 25 mm to 30 mm and have a characteristic impedance of, for example, 25Ω.

For the light-emitting circuit 75 and the bias current supply circuit 68, there is no need to particularly consider impedance. Preferably, the light-emitting circuit 75 and the bias current supply circuit 68 have low impedance in terms of DC and high impedance in terms of AC.

The resistors 13 and 14 are damping resistors provided to correct the frequency characteristics of a burst optical signal and to compensate for a reduction in impedance caused by parasitic capacitance on the side of the output buffer circuit 63.

The filter circuit 17 is provided between the resistor 13 and the resistor 14 to remove a high frequency component such as a modulation current flowing between the differential drive circuit 41 and the light-emitting circuit 75.

The operation of the drive circuit 51 is as follows. Specifically, when the transmit data has the logical value "1", the N-channel MOS transistor 15 is turned off and the N-channel MOS transistor 16 is turned on. By this, a current IM1 flows from the power supply node of the light-emitting circuit 75 to the ground node of the output buffer circuit 63 through the light-emitting device LD and the N-channel MOS transistor 16 in the differential drive circuit 41. Namely, a modulation current of a certain magnitude is supplied to the light-emitting device LD.

When the transmit data has the logical value "0", the N-channel MOS transistor 15 is turned on and the N-channel MOS transistor 16 is turned off. By this, a current IM0 flows from the power supply node of the light-emitting circuit 75 to the ground node of the output buffer circuit 63 through the N-channel MOS transistor 15 in the differential drive circuit 41 without interposing the light-emitting device LD. Namely, the magnitude of a modulation current to the light-emitting device LD is zero.

In addition, irrespective of the logical value of the transmit data, by the current source 33, a bias current Ibias flows from the power supply node of the light-emitting circuit 75 to the ground node of the bias current supply circuit 68 through the light-emitting device LD.

Figure 6:
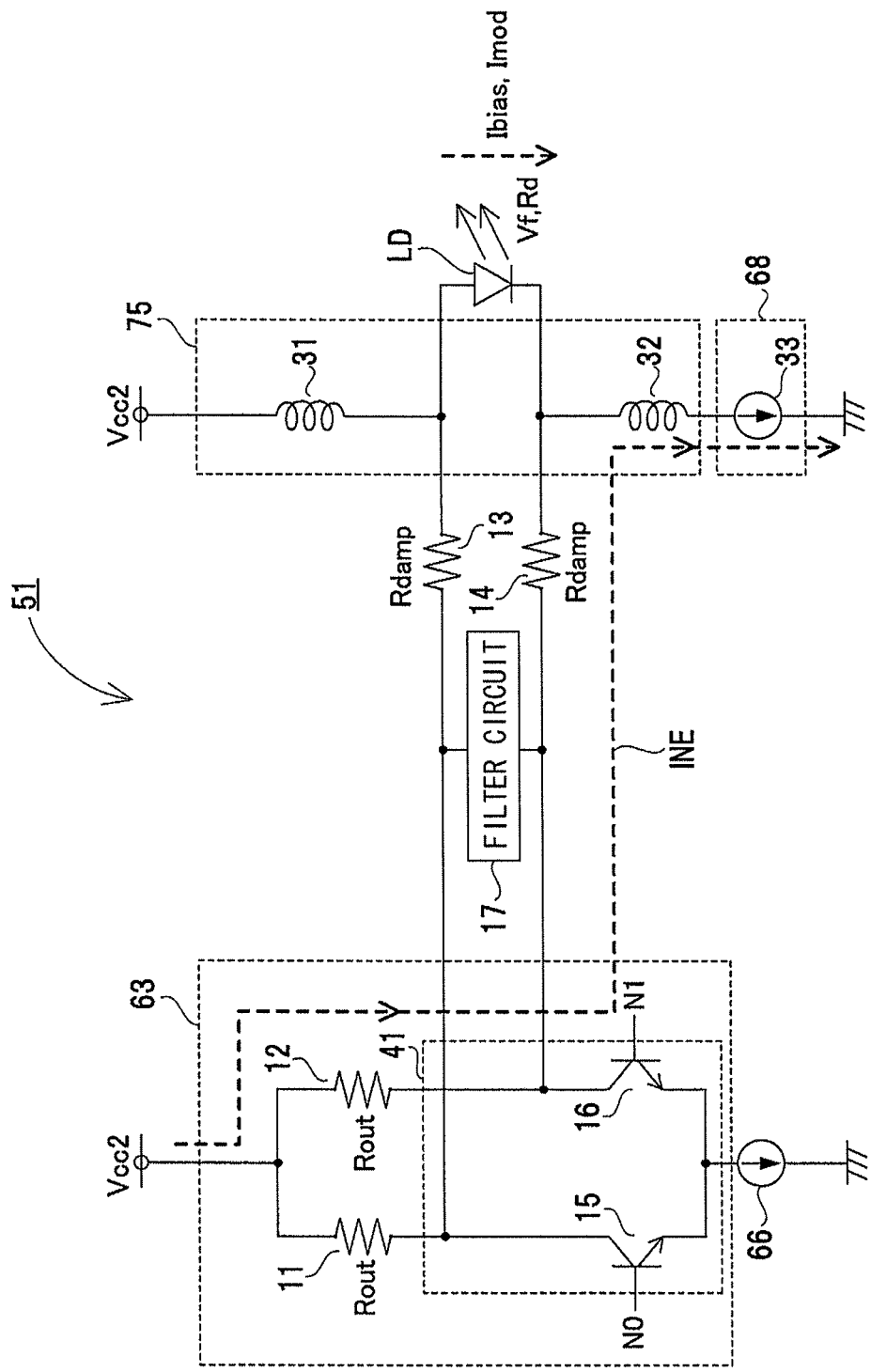
FIG. 6 is a diagram showing a reactive current flowing in the drive circuit shown in FIG. 5.

FIG. 6 is a diagram showing a reactive current flowing in the drive circuit shown in FIG. 5.

Referring to FIG. 6, in the drive circuit 51, when the transmit data has the logical value "1", a reactive current INE flows from the power supply node of the output buffer circuit 63 to the ground node of the current source 33 through the resistor 12 and the resistor 14.

Now, when the resistance value of each of the resistor 11 and the resistor 12 is Rout, the resistance value of each of the resistor 13 and the resistor 14 is Rdamp, the forward voltage and differential resistance of the light-emitting device LD are Vf and Rd, respectively, and the bias current and the modulation current which flow via the light-emitting device LD are Ibias and Imod, respectively, the reactive current INE is represented by the following equation:

$$INE = Vf/(Rout + Rdamp)$$

In addition, the output current y of the current source 66 is represented by the following equation:

$$y = Imod + [\{Vf + (Rd + Rdamp) \times Imod\}/Rout]$$

Here, since the input of the current source 66 has high impedance, all of the reactive current INE flows to the current source 33. Namely, the output current x of the current source 33 is represented by the following equation:

$$x = Ibias + Vf/(Rout + Rdamp)$$

Specifically, for example, when Vf=1.4 [V], Rout=25[Ω], and Rdamp=6[Ω], the output current x of the current source 33 is represented by the following equation:

$$x = Ibias + 45.2$$

In the embodiment of the present invention, by adopting a configuration such as that shown below in the drive circuit of the optical transceiver 21, the reactive current INE is reduced.

Figure 7:
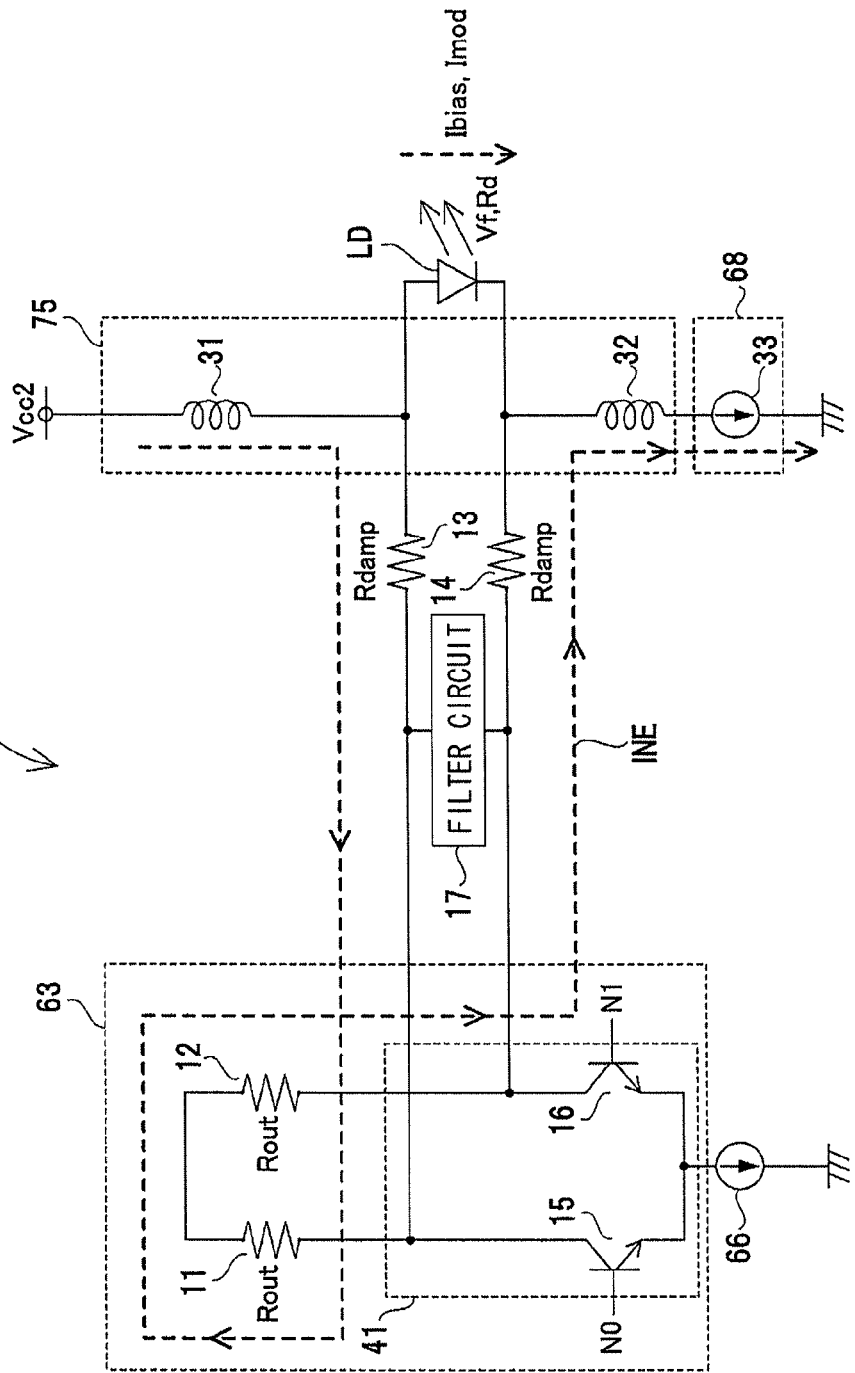
FIG. 7 is a diagram showing a configuration of a drive circuit of the optical transceiver according to the embodiment of the present invention.

FIG. 7 is a diagram showing a configuration of a drive circuit of the optical transceiver according to the embodiment of the present invention.

Referring to FIG. 7, in a drive circuit 52, compared to the drive circuit 51 shown in FIG. 5, a first end of a resistor 11 and a first end of a resistor 12 are not connected to a power supply node. By this, power supply of a current supplied to a light-emitting device LD by a differential drive circuit 41 is supplied from a light-emitting circuit 75. Namely, the differential drive circuit 41 supplies a current to the light-emitting device LD using power supplied from the light-emitting circuit 75. A connection node between the resistor 11 and the resistor 12 is lower in potential than a power supply node of the light-emitting circuit 75 by an amount corresponding to a drop in the voltages of a resistor 13 and the resistor 11. Namely, the potential of the connection node between the resistor 11 and the resistor 12 is determined by a power supply voltage Vcc2 supplied from the power supply node of the light-emitting circuit 75.

For example, in a configuration in which an output buffer circuit 63 and the light-emitting circuit 75 are AC-coupled to each other instead of being DC-coupled to each other, there is no direct-current power supply path to the differential drive circuit 41. Hence, the connection node between the resistor 11 and the resistor 12 in the output buffer circuit 63 needs to be connected to the power supply node.

However, in the drive circuit 52, the output buffer circuit 63 and the light-emitting circuit 75 are DC-coupled to each other. Hence, since direct-current power can be supplied from the light-emitting circuit 75 through the DC coupling, there is no need to connect the connection node between the resistor 11 and the resistor 12 to the power supply node.

Namely, by the configuration in which, as shown in FIG. 7, the connection node between the resistor 11 and the resistor 12 and the power supply node are not connected to each other, a path for a reactive current INE flowing between the output buffer circuit 63 and a bias current supply circuit 68 through the light-emitting circuit 75 includes a path between the power supply node of the light-emitting circuit 75 and the output buffer circuit 63.

Specifically, the reactive current INE flows from the power supply node of the light-emitting circuit 75 to a ground node through an inductor 31, the resistor 13, the resistor 11, the resistor 12, a resistor 14, an inductor 32, and the bias current supply circuit 68 in this order. By this, the impedance of the path for the reactive current INE increases compared to the drive circuit 51 shown in FIG. 5, enabling to reduce the reactive current INE.

In the drive circuit 52, the reactive current INE is represented by the following equation:

$$INE = Vf/\{2\times(Rout+Rdamp)\}$$

In addition, the output current y of a current source 66 is represented by the following equation:

$$y = I\mathrm{mod} + [\{Vf+(Rd+Rdamp)\times I\mathrm{mod}\}/Rout]$$

Here, since the input of the current source 66 has high impedance, all of the reactive current INE flows to a current source 33. Namely, the output current x of the current source 33 is represented by the following equation:

$$x = I\mathrm{bias} + Vf/\{2\times(Rout+Rdamp)\}$$

Specifically, for example, when Vf=1.4 [V], Rout=25[Ω], and Rdamp=6[Ω], the output current x of the current source 33 is represented by the following equation:

$$x = I\mathrm{bias} + 22.6$$

Namely, the drive circuit 52 can reduce current consumption by 22.6 mA, compared to the drive circuit 51 shown in FIG. 5.

In the drive circuit 52, when the duty ratio of transmit data is constant, the potential of the connection node between the resistor 11 and the resistor 12 does not change. Thus, at the connection node, ground potential in terms of AC is stable. Namely, when the optical transceiver 21 transmits a continuous optical signal, stable transmission characteristics can be obtained.

On the other hand, when the optical transceiver 21 transmits a burst optical signal, the duty ratio of transmit data during a period during which the optical signal is not transmitted is zero. Thus, the duty ratio changes at timing at which transmission of the optical signal starts. Hence, the potential of the connection node between the resistor 11 and the resistor 12 becomes unstable, which may cause ringing in the burst optical signal.

In view of this, in the embodiment of the present invention, by further adopting a configuration such as that shown below in the drive circuit of the optical transceiver 21, the above-described problem can also be solved.

Figure 8:
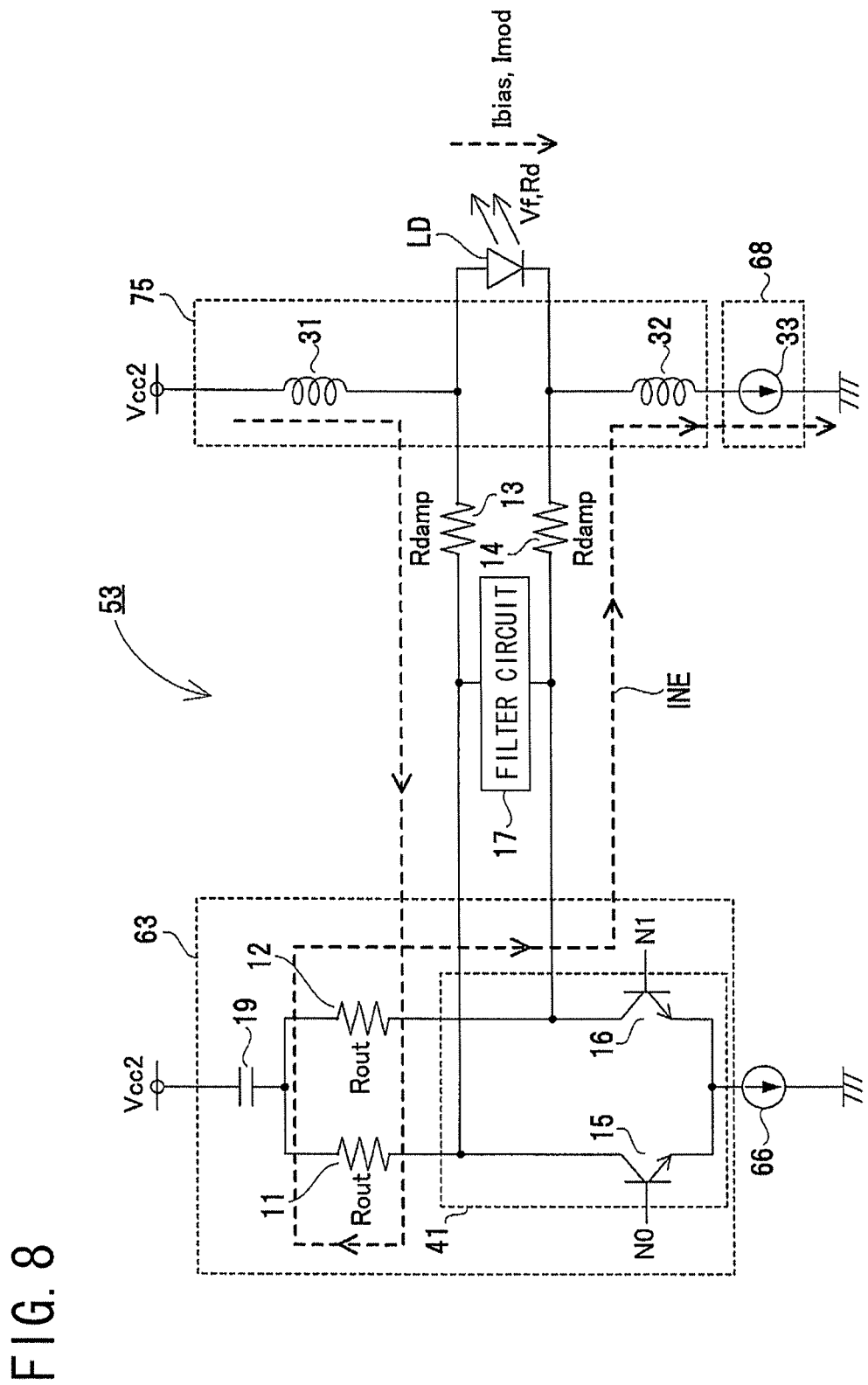
FIG. 8 is a diagram showing a configuration of a drive circuit of the optical transceiver according to the embodiment of the present invention.

FIG. 8 is a diagram showing a configuration of a drive circuit of the optical transceiver according to the embodiment of the present invention.

Referring to FIG. 8, in a drive circuit 53, compared to the drive circuit 52 shown in FIG. 7, an output buffer circuit 63 further includes a capacitor 19.

The capacitor 19 is connected between a node to which a power supply voltage Vcc2 which is a fixed voltage is supplied and a connection node between a resistor 11 and a resistor 12. Namely, a first end of the resistor 11 and a first end of the resistor 12 are connected to the power supply node through the capacitor 19. The capacitance value of the capacitor 19 is, for example, 1000 pF.

By this, the resistors 11 and 12 are AC-coupled to the node, to which a fixed voltage is supplied, without interposing a light-emitting circuit 75. Note that the fixed voltage is not limited to the power supply voltage Vcc2 and may be, for example, a ground voltage.

As such, in the drive circuit 53, a capacitive element is connected between the connection node between termination resistors whose potential is likely to become unstable in the drive circuit 52 shown in FIG. 7, and the power supply node.

By this, the potential of the connection node can be stabilized at the power supply voltage Vcc2. In addition, since the power supply node and each termination resistor are AC-coupled to each other, a reactive current INE from the power supply node such as that shown in FIG. 6 can be prevented from flowing. In the drive circuit 53, the same reactive current INE as that of the drive circuit 52 shown in FIG. 7 flows.

In the drive circuit 53, the reactive current INE is represented by the following equation:

$$INE = Vf/\{2\times(Rout+Rdamp)\}$$

In addition, the output current y of a current source 66 is represented by the following equation:

$$y = I\mathrm{mod} + [\{Vf+(Rd+Rdamp)\times I\mathrm{mod}\}/Rout]$$

Here, since the input of the current source 66 has high impedance, all of the reactive current INE flows to a current source 33. Namely, the output current x of the current source 33 is represented by the following equation:

$$x = I\mathrm{bias} + Vf/\{2\times(Rout+Rdamp)\}$$

Specifically, for example, when Vf=1.4 [V], Rout=25[Ω], and Rdamp=6[Ω], the output current x of the current source 33 is represented by the following equation:

$$x = I\mathrm{bias} + 22.6$$

Namely, as with the drive circuit 52 shown in FIG. 7, the drive circuit 53 can reduce current consumption by 22.6 mA, compared to the drive circuit 51 shown in FIG. 5.

Figure 9:
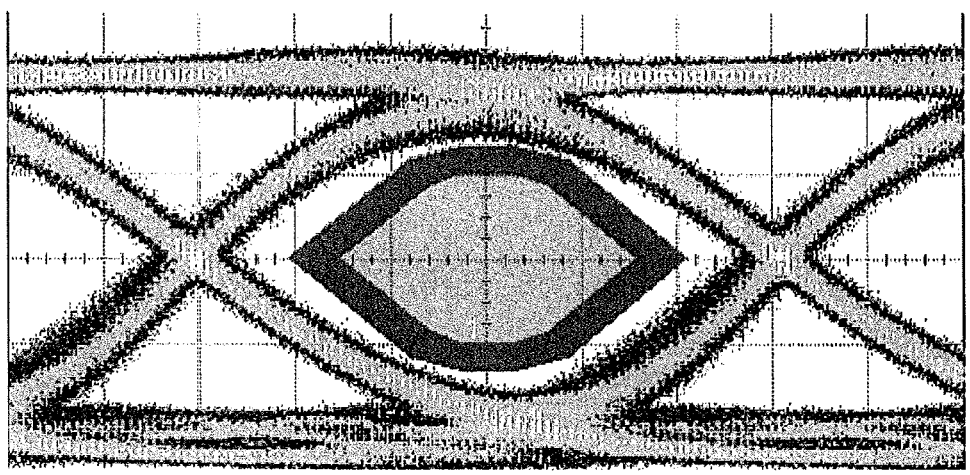
FIG. 9 is a diagram showing the measurement results of an optical signal (continuous signal) outputted from a drive circuit 51.
Figure 10:
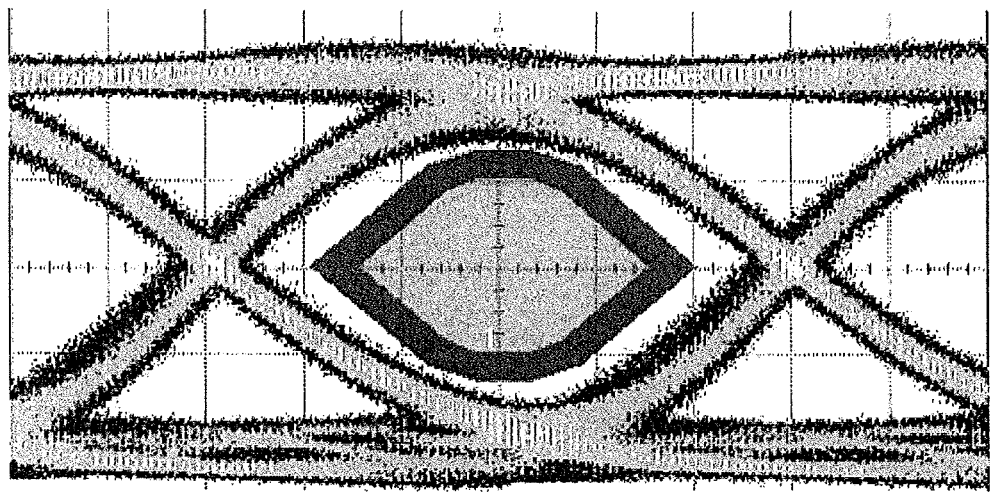
FIG. 10 is a diagram showing the measurement results of an optical signal (continuous signal) outputted from a drive circuit 52.
Figure 11:
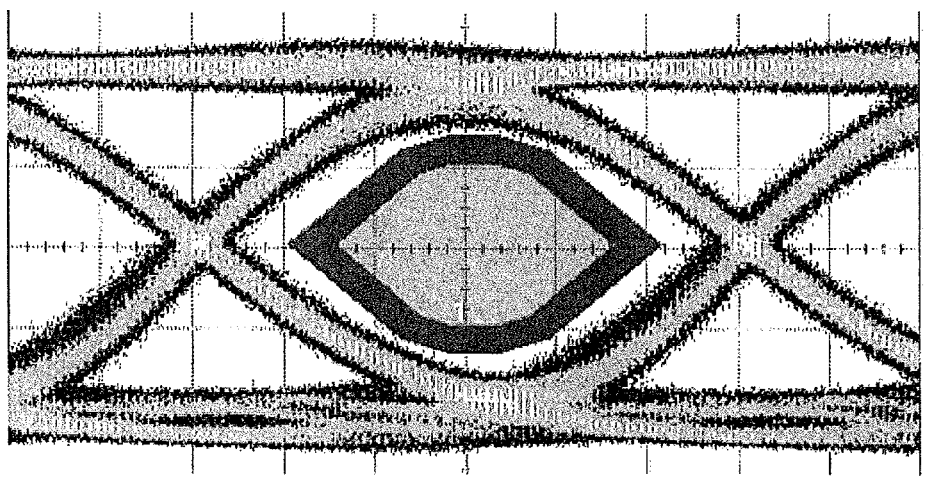
FIG. 11 is a diagram showing the measurement results of an optical signal (continuous signal) outputted from a drive circuit 53.
Figure 12:
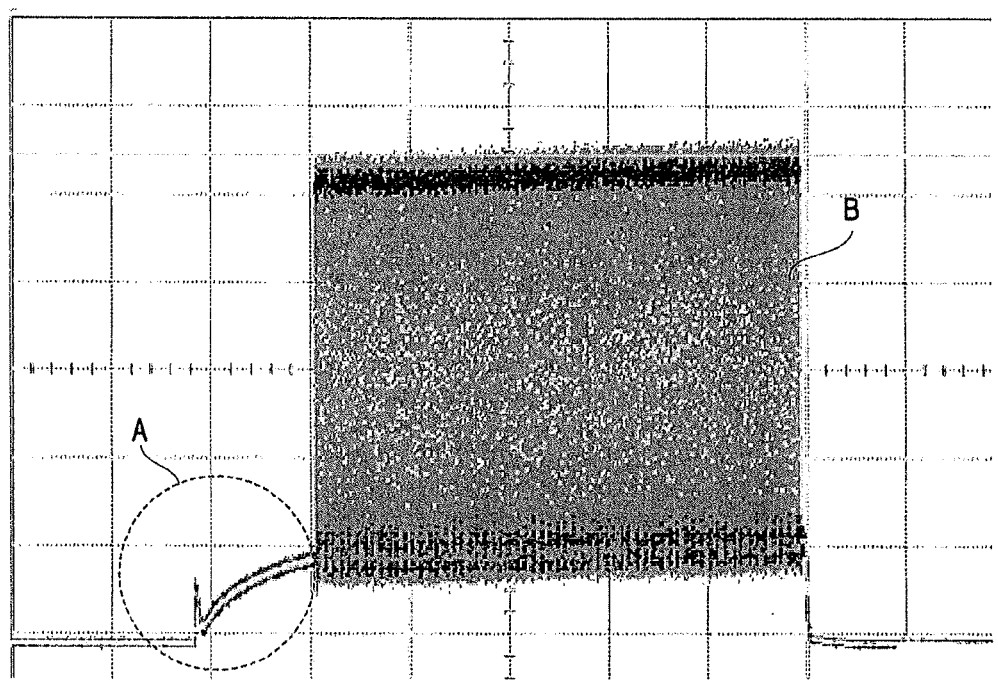
FIG. 12 is a diagram showing the measurement results of a burst optical signal outputted from the drive circuit 51.
Figure 13:
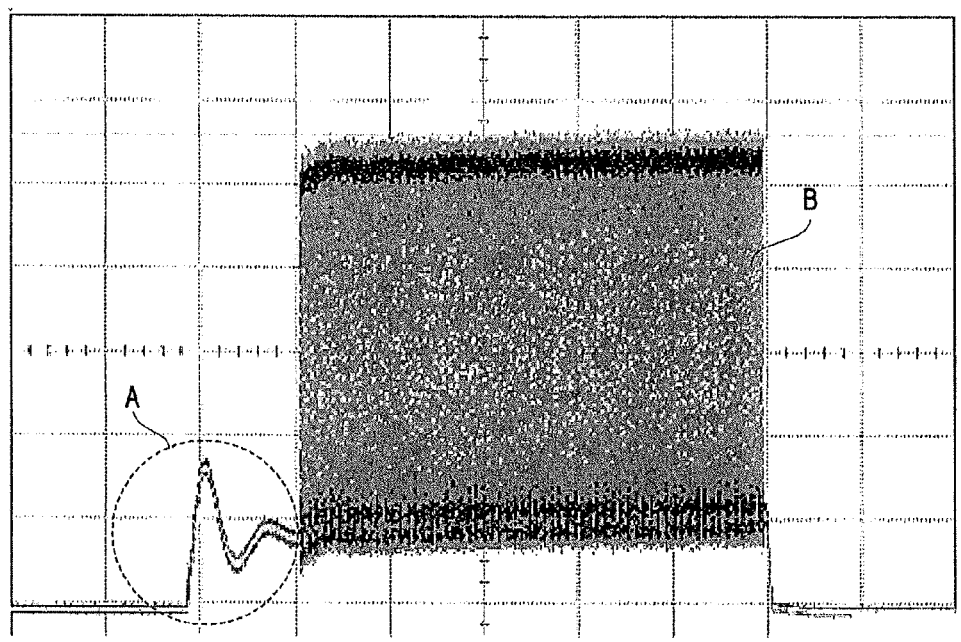
FIG. 13 is a diagram showing the measurement results of a burst optical signal outputted from the drive circuit 52.
Figure 14:
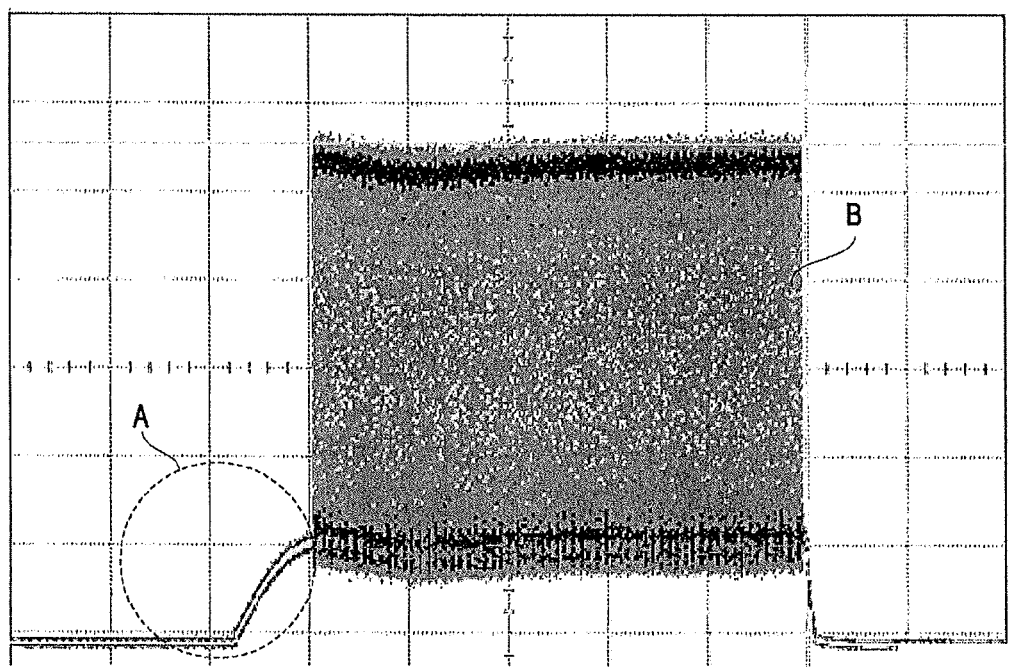
FIG. 14 is a diagram showing the measurement results of a burst optical signal outputted from the drive circuit 53.

FIG. 9 is a diagram showing the measurement results of an optical signal (continuous signal) outputted from the drive circuit 51. FIG. 10 is a diagram showing the measurement results of an optical signal (continuous signal) outputted from the drive circuit 52. FIG. 11 is a diagram showing the measurement results of an optical signal (continuous signal) outputted from the drive circuit 53. FIG. 12 is a diagram showing the measurement results of a burst optical signal outputted from the drive circuit 51. FIG. 13 is a diagram showing the measurement results of a burst optical signal outputted from the drive circuit 52. FIG. 14 is a diagram showing the measurement results of a burst optical signal outputted from the drive circuit 53.

FIG. 9 to FIG. 11 show the eye patterns of the optical signals. In addition, in FIG. 12 to FIG. 14, B is a portion where the optical signal repeats logical high level and logical low level.

Referring to FIG. 9 to FIG. 11, even if the connection between the first end of the resistor 11 and the first end of the resistor 12 and the power supply node is disconnected as shown in FIG. 7 and even if the capacitor 19 is connected between the first end of the resistor 11 and the first end of the resistor 12 and the power supply node as shown in FIG. 8, the waveforms of the eye patterns are not distorted, and similar eye patterns to that for the drive circuit shown in FIG. 5 are obtained. Namely, it can be seen that the drive circuits shown in FIG. 7 and FIG. 8 obtain equivalent optical signal transmission characteristics to those of the drive circuit shown in FIG. 5.

In addition, in the burst optical signal shown in FIG. 13, the ringing is large at a portion A where the burst optical signal rises, compared to the burst optical signal shown in FIG. 12.

On the other hand, in the burst optical signal shown in FIG. 14, it can be seen that there is no ringing at a portion A where the burst optical signal rises, compared to the burst optical signal shown in FIG. 13, and thus, the burst optical signal transmission characteristics are improved.

In the measurement, in FIG. 12 to FIG. 14, the currents flowing from the power supply node of the light-emitting circuit 75 to the ground node of the bias current supply circuit 68 are 92 mA, 69 mA, and 69 mA, respectively. Namely, in the drive circuits shown in FIG. 7 and FIG. 8, the current consumption is reduced by about 23 mA, compared to the drive circuit shown in FIG. 5.

Meanwhile, in the laser drive circuit described in Patent Literature 1, since the differential drive circuit and the laser diode are AC-coupled to each other by the capacitive element, burst response characteristics deteriorate by the time constants of the termination resistor and the capacitive element. If, for example, DC coupling by a resistor is performed instead of AC coupling in order to prevent such a deterioration of burst response characteristics, a reactive current which does not contribute to the drive of the laser diode may flow from the differential drive circuit to the bias circuit through the DC coupling.

On the other hand, in the drive circuit according to the embodiment of the present invention, the output buffer circuit 63 supplies a modulation current of a magnitude according to the logical value of data to be transmitted, to the light-emitting device LD. In the output buffer circuit 63, the differential drive circuit 41 switches whether to supply a current to the light-emitting device LD, according to the logical value of the data. The resistors 11 and 12 are connected between the differential outputs of the differential drive circuit 41. Then, the differential drive circuit 41 and the light-emitting circuit 75 are DC-coupled to each other, and power supply of the current supplied to the light-emitting device LD by the differential drive circuit 41 is supplied from the light-emitting circuit 75.

Namely, a path between the power supply node of the output buffer circuit 63 and the termination resistors 11 and 12 is blocked. Then, power supply to the output buffer circuit 63 is supplied from a power supply node for a bias current, i.e., the power supply node of the light-emitting circuit 75.

By such a configuration, the impedance of a path for a reactive current increases. Thus, since the reactive current which does not contribute to the drive of the light-emitting device can be halved as described in, for example, FIG. 7, power consumption can be reduced.

In addition, in the drive circuit according to the embodiment of the present invention, the resistors 11 and 12 are AC-coupled to a node, to which a fixed voltage is supplied, without interposing the light-emitting circuit 75.

Namely, in the configuration in which the path between the power supply node of the output buffer circuit 63 and the termination resistors 11 and 12 is blocked, since ringing may occur in a burst optical signal, a capacitor is mounted between the power supply node of the output buffer circuit 63 and the termination resistors 11 and 12 to bypass unwanted high frequency components.

By such a configuration, a reactive current which does not contribute to the drive of the light-emitting device can be reduced, and burst response can be stabilized.

In addition, in the drive circuit according to the embodiment of the present invention, the resistor 11 and the resistor 12 are connected in series between the drain of the N-channel MOS transistor 15 and the drain of the N-channel MOS transistor 16. The connection node between the drain of the N-channel MOS transistor 15 and the resistor 11 is DC-coupled to the connection node between the anode of the light-emitting device LD and a node to which a direct-current power supply voltage is supplied. The connection node between the drain of the N-channel MOS transistor 16 and the resistor 12 is DC-coupled to the connection node between the cathode of the light-emitting device LD and the bias current supply circuit 68.

By such a configuration, an appropriate circuit that DC-couples the differential drive circuit 41 and the termination resistors 11 and 12 to the light-emitting device LD can be provided.

In addition, in the drive circuit according to the embodiment of the present invention, the capacitor 19 is connected between a node to which a fixed voltage is supplied and the connection node between the resistor 11 and the resistor 12.

By such a configuration, an appropriate circuit that stabilizes the potential of the connection node between the termination resistor 11 and the termination resistor 12 can be provided.

Note that although in the drive circuit according to the embodiment of the present invention, the differential drive circuit 41 is configured to include a transistor circuit of one stage, the configuration is not limited thereto. The differential drive circuit 41 may be configured to include transistor circuits of a plurality of stages. In this case, it is sufficient that a direct-current power supply current be supplied to a circuit of the last stage from the light-emitting circuit 75.

The above-described embodiments are to be considered in all respects as illustrative and not restrictive. The scope of the present invention is indicated by the appended claims, rather than the foregoing description, and is intended to include all changes which come within the meanings and range of equivalency of the claims.

REFERENCE SIGNS LIST 11 to 14 and R1: RESISTOR
15 and 16: N-CHANNEL MOS TRANSISTOR
17: FILTER CIRCUIT
19: CAPACITOR
21: OPTICAL TRANSCEIVER
22: PON RECEPTION PROCESSING UNIT
23: BUFFER MEMORY
24: UN TRANSMISSION PROCESSING UNIT
25: UNI PORT
26: UN RECEPTION PROCESSING UNIT
27: BUFFER MEMORY
28: PON TRANSMISSION PROCESSING UNIT
29: CONTROL UNIT
31 and 32: INDUCTOR
33: CURRENT SOURCE
41: DIFFERENTIAL DRIVE CIRCUIT
51 to 53: DRIVE CIRCUIT
61: PREBUFFER CIRCUIT

62: EQUALIZER CIRCUIT
63: OUTPUT BUFFER CIRCUIT (MODULATION CURRENT SUPPLY CIRCUIT)
64 to 66: CURRENT SOURCE
67: TIMING CIRCUIT
68: BIAS CURRENT SUPPLY CIRCUIT
69: MASTER I/F (INTERFACE)
70: CPU
71: SLAVE I/F
72: CONTROL REGISTER
73: MEMORY UNIT
75: LIGHT-EMITTING CIRCUIT
201: OPTICAL LINE TERMINAL
202A, 202B, 202C, and 202D: OPTICAL NETWORK UNIT
301: PON SYSTEM
C1 and C2: CAPACITOR
LD: LIGHT-EMITTING DEVICE
SP1 and SP2: SPLITTER
OPTF: OPTICAL FIBER

The invention claimed is:

1. A drive circuit comprising:
a bias current supply circuit for supplying a bias current to a light-emitting device for transmitting an optical signal, the light-emitting device being included in a light-emitting circuit; and
a modulation current supply circuit for supplying the light-emitting device with a modulation current of a magnitude according to a logical value of data to be transmitted, wherein
the modulation current supply circuit includes:
a differential drive circuit for switching whether to supply a current to the light-emitting device according to the logical value of the data; and
a termination resistor connected between differential outputs of the differential drive circuit and AC-coupled to a node without interposing the light-emitting circuit, the node being supplied with a fixed voltage, and,
the differential drive circuit and the light-emitting circuit are DC-coupled to each other, and power supply of the current supplied to the light-emitting device by the differential drive circuit is supplied from the light-emitting circuit.

2. The drive circuit according to claim 1, wherein
the differential drive circuit includes:
a first transistor having a first conduction electrode and a second conduction electrode, the first conduction electrode being DC-coupled to a first end of the light-emitting device;
a second transistor having a first conduction electrode and a second conduction electrode, the first conduction electrode being DC-coupled to a second end of the light-emitting device, and the second conduction electrode being electrically connected to the second conduction electrode of the first transistor; and
a first termination resistor and a second termination resistor that are connected in series between the first conduction electrode of the first transistor and the first conduction electrode of the second transistor, wherein
a connection node between the first conduction electrode of the first transistor and the first termination resistor is DC-coupled to a connection node between the first end of the light-emitting device and a node to which a direct-current power supply voltage is supplied, and
a connection node between the first conduction electrode of the second transistor and the second termination resistor is DC-coupled to a connection node between the second end of the light-emitting device and the bias current supply circuit.

3. The drive circuit according to claim 2, wherein
the modulation current supply circuit further includes:
a capacitor connected between a node to which a fixed voltage is supplied and a connection node between the first termination resistor and the second termination resistor.

4. An optical network unit in a communication system where optical signals from a plurality of optical network units to an optical line terminal are time-division multiplexed, the optical network unit comprising:
a light-emitting circuit including a light-emitting device for transmitting the optical signal; and
a drive circuit for driving the light-emitting device, wherein
the drive circuit includes:
a bias current supply circuit for supplying a bias current to the light-emitting device; and
a modulation current supply circuit for supplying the light-emitting device with a modulation current of a magnitude according to a logical value of data to be transmitted, and,
the modulation current supply circuit includes:
a differential drive circuit for switching whether to supply a current to the light-emitting device according to the logical value of the data; and
a termination resistor connected between differential outputs of the differential drive circuit and AC-coupled to a node without interposing the light-emitting circuit, the node being supplied with a fixed voltage, and,
the differential drive circuit and the light-emitting circuit are DC-coupled to each other, and power supply of the current supplied to the light-emitting device by the differential drive circuit is supplied from the light-emitting circuit.

* * * * *